United States Patent
Kim

(10) Patent No.: US 12,181,432 B2
(45) Date of Patent: Dec. 31, 2024

(54) SEMICONDUCTOR DEVICES INCLUDING CRACK SENSOR

(71) Applicant: SK hynix Inc., Icheon-si (KR)

(72) Inventor: Jong Su Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/464,040

(22) Filed: Sep. 8, 2023

(65) Prior Publication Data

US 2023/0417696 A1 Dec. 28, 2023

Related U.S. Application Data

(63) Continuation of application No. 17/689,489, filed on Mar. 8, 2022, now Pat. No. 11,860,116.

(30) Foreign Application Priority Data

Oct. 13, 2021 (KR) .................. 10-2021-0136148

(51) Int. Cl.
| | |
|---|---|
| *G01N 27/20* | (2006.01) |
| *H01L 21/66* | (2006.01) |
| *H01L 23/522* | (2006.01) |
| *H01L 23/64* | (2006.01) |
| *H01L 49/02* | (2006.01) |

(52) U.S. Cl.
CPC ............ *G01N 27/20* (2013.01); *H01L 22/34* (2013.01); *H01L 23/5228* (2013.01); *H01L 28/20* (2013.01)

(58) Field of Classification Search
CPC ......... G01N 27/20; H01L 22/32; H01L 22/34; H01L 23/647; H01L 23/5228; H01L 28/20

See application file for complete search history.

(56) References Cited

U.S. PATENT DOCUMENTS

| | | | | |
|---|---|---|---|---|
| 7,247,921 B2* | 7/2007 | Sugiura | .............. | H01L 22/34 |
| | | | | 257/107 |
| 7,716,992 B2* | 5/2010 | Maloney | .............. | H01L 23/585 |
| | | | | 73/777 |
| 9,159,646 B2* | 10/2015 | Xie | .............. | H01L 22/32 |
| 11,088,037 B2* | 8/2021 | Chen | .............. | H01L 23/585 |
| 11,215,661 B2* | 1/2022 | Polomoff | .............. | G01R 31/2853 |
| 2014/0049284 A1* | 2/2014 | Pak | .............. | G01R 31/2601 |
| | | | | 324/762.01 |
| 2014/0346509 A1* | 11/2014 | Zundel | .............. | H01L 22/34 |
| | | | | 438/10 |
| 2017/0309530 A1* | 10/2017 | Ilkov | .............. | H01L 23/562 |
| 2021/0167056 A1* | 6/2021 | Or-Bach | .............. | H01L 21/823871 |

FOREIGN PATENT DOCUMENTS

KR 1020200032470 A 3/2020

* cited by examiner

*Primary Examiner* — Omar F Mojaddedi
(74) *Attorney, Agent, or Firm* — WILLIAM PARK & ASSOCIATES LTD.

(57) ABSTRACT

A semiconductor device includes a target layer disposed on a substrate, and a crack sensor for detecting a crack generated in the target layer. The crack sensor includes a first conductive pattern positioned at a bottom surface of the target layer, a second conductive pattern positioned on a top surface of the target layer, the top surface being opposite to the bottom surface of the target layer, a plurality of resistors, and nodes. The plurality of resistors are connected in parallel to each other through the first conductive pattern and the second conductive pattern. Each of the plurality of resistors is disposed to substantially penetrate the target layer.

6 Claims, 17 Drawing Sheets

SEMICONDUCTOR DEVICES INCLUDING CRACK SENSOR

CROSS-REFERENCE TO RELATED APPLICATIONS

The present application is a continuation application of U.S. patent application Ser. No. 17/689,489, filed on Mar. 8, 2022, and claims priority under 35 U.S.C 119(a) to Korean Applications No. 10-2021-0136148, filed on Oct. 13, 2021, in the Korean Intellectual Property Office, which is incorporated herein by reference in its entirety.

BACKGROUND

1. Technical Field

The present disclosure generally relates to a semiconductor technology, and more particularly, to a semiconductor device including a crack sensor for detecting a crack that may occur in a semiconductor chip.

2. Related Art

Integrated circuits (ICs) may be repeatedly formed on a wafer, and the wafer may be separated into individual semiconductor chips. The wafer may be diced or cut into a plurality of semiconductor chips. The separated semiconductor chips may be packaged into semiconductor packages. During the process of separating a wafer into semiconductor chips, cracks may be generated in the semiconductor chips. The crack may indicate that a layer constituting the semiconductor chip is broken. The crack may indicate delamination in which one layer is lifted from another. When dicing a wafer into semiconductor chips, stresses applied to the layers constituting the semiconductor chip may vary from a layer to another layer. Accordingly, the cracks may propagate from the dicing region to the inside of the semiconductor chip. Such cracks may cause malfunction or failure of the semiconductor chip. There is a demand for detecting cracks generated in semiconductor chips.

SUMMARY

An aspect of the present disclosure may present a semiconductor device including a substrate including chip regions and a scribe lane region; a target layer disposed on the substrate; and a crack sensor for detecting a crack generated in the target layer. The crack sensor may include a first conductive pattern positioned at a bottom surface of the target layer; a second conductive pattern positioned on a top surface of the target layer, the top surface being opposite to the bottom surface of the target layer; a plurality of resistors substantially penetrating the target layer, the plurality of resistors connected in parallel to each other through the first conductive pattern and the second conductive pattern, wherein each of the plurality of resistors is disposed sequentially away from the chip region; and a first node and a second node connected to the first conductive pattern and the second conductive patterns, respectively.

Another aspect of the present disclosure may present a semiconductor device including a target layer disposed on a substrate; and a crack sensor for detecting a crack generated in the target layer. The crack sensor may include a first conductive pattern positioned at a bottom surface of the target layer; a second conductive pattern positioned on a top surface of the target layer, the top surface being opposite to the bottom surface of the target layer; a plurality of resistors substantially penetrating the target layer, the plurality of resistors connected in parallel to each other through the first conductive pattern and the second conductive pattern; and a first node and a second node connected to the first conductive pattern and the second conductive pattern, respectively.

DETAILED DESCRIPTION

Figure 1:
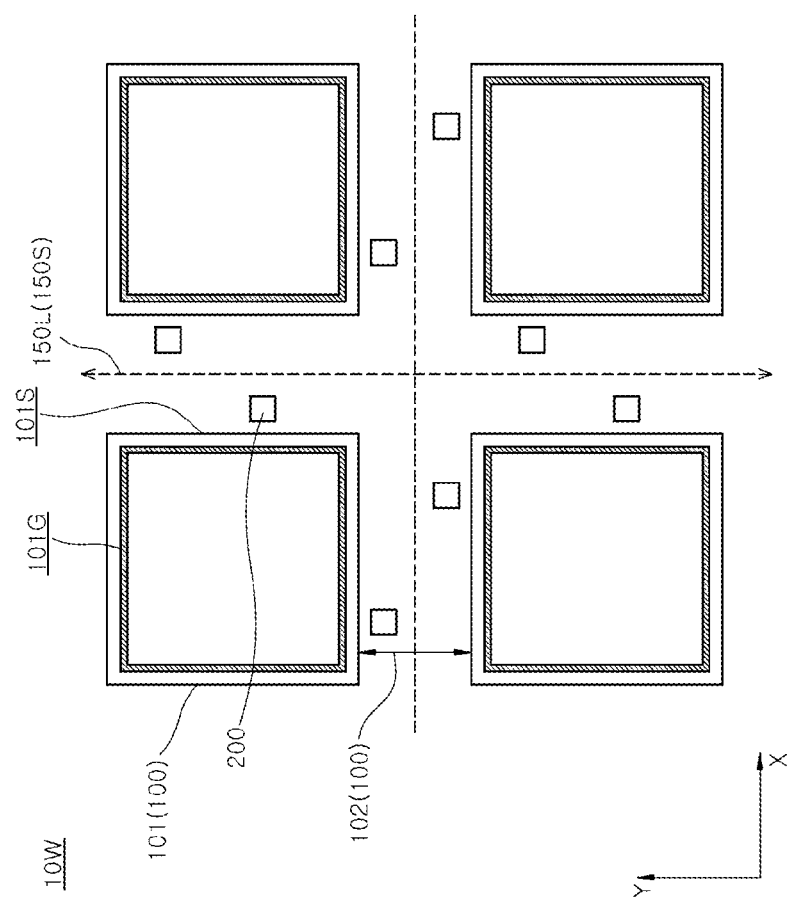
FIG. 1 is a schematic plan view illustrating a semiconductor device according to an embodiment of the present disclosure.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first" and "second," "side," "top," and "bottom or lower" may be used herein to describe various devices, these devices should not be limited by these terms. These terms are only used to distinguish one device from another device, but not used to indicate a particular sequence or number of devices.

The semiconductor device may include a semiconductor substrate or a structure in which a plurality of semiconductor substrates are stacked. The semiconductor device may refer to a semiconductor package structure in which a structure in which semiconductor substrates are stacked is packaged. The semiconductor substrate may refer to a semiconductor wafer, a semiconductor die, or a semiconductor chip in which electronic components and devices are integrated. The semiconductor chip may refer to a memory chip in which memory integrated circuits, such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated, logic dies or ASIC chips in which logic circuits are integrated in a semiconductor substrate, or processors such as application processors (Aps), graphic processing units (GPUs), central processing units (CPUs) or system-on-chips (SoCs). The semiconductor device may be employed in information communication systems such as mobile phones, electronic systems associated with biotechnology or health care, or wearable electronic systems. The semiconductor device may be applicable to internet of things (IoT).

Same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

FIG. 1 is a schematic plan view illustrating a semiconductor device 10W according to an embodiment of the present disclosure. FIG. 1 may illustrate a shape in the X-Y plane of the semiconductor device 10W before being diced into individual semiconductor chips.

Referring to FIG. 1, the semiconductor device 10W may include a wafer or a semiconductor substrate 100 in which integrated circuits are integrated. The integrated circuits may include memory devices, such as dynamic random access memory (DRAM) devices or NAND flash memory devices. The semiconductor device 10W may be diced into individual semiconductor chips along a dicing line 150L.

The semiconductor device 10W may include chip regions 101 and a scribe lane region 102. The chip region 101 and the scribe lane region 102 of the semiconductor device 10W may correspond to chip regions 101 and a scribe lane region 102 of the semiconductor substrate 100. The chip regions 101 may correspond to regions in which integrated circuits are integrated. The chip regions 101 may include rectangular or square regions in a plan view. A guard wall 101G that protects the integrated circuits may be disposed in an inner edge portion of each of the chip regions 101. The guard wall 101G may be formed in a shape to extend along a boundary between the chip region 101 and the scribe lane region 102. The scribe lane region 102 may be a region that surrounds the chip region 101. The dicing line 150L may be set as a certain portion within the scribe lane region 102.

The semiconductor device 10W may include crack sensors 200 for detecting cracks. The crack sensors 20 may be configured to detect cracks that may occur when the semiconductor device 10W is diced into semiconductor chips. The crack sensors 200 may be disposed at locations at which a crack or cracks are likely to occur. The crack sensors 200 may be disposed within the scribe lane region 102. A plurality of crack sensors 200 may be disposed in the scribe lane region 102 while being spaced apart from each other. The crack sensors 200 may be disposed in local regions of the scribe lane region 102 that is adjacent to rectangular-shaped side of each of the chip regions 101. The rectangular-shaped side of each of the chip regions 101 may correspond to a portion that constitutes a boundary 101S between the chip region 101 and the scribe lane region 102.

Because the dicing lines 150L are located in portions of the scribe lane region 102, and the dicing proceeds along the dicing lines 150L, a crack or cracks may be preferentially generated in the scribe lane region 102 where the dicing lines 150L are located. As the dicing proceeds along the dicing lines 150L, a side surface 150S of each of the diced semiconductor chips may be exposed. The stress due to dicing may be relatively concentrated on the side surfaces 150S of the semiconductor chips so that cracks may be generated on the side surfaces 150S of the semiconductor chips, propagating into the semiconductor chips. In order for the crack sensors 200 to effectively detect the cracks, the crack sensors 200 may be disposed in the scribe lane region 102 that is adjacent to the dicing lines 150L. The crack sensors 200 may be disposed in various places in the scribe lane region 102 while being arranged to surround the chip regions 101.

Figure 2:
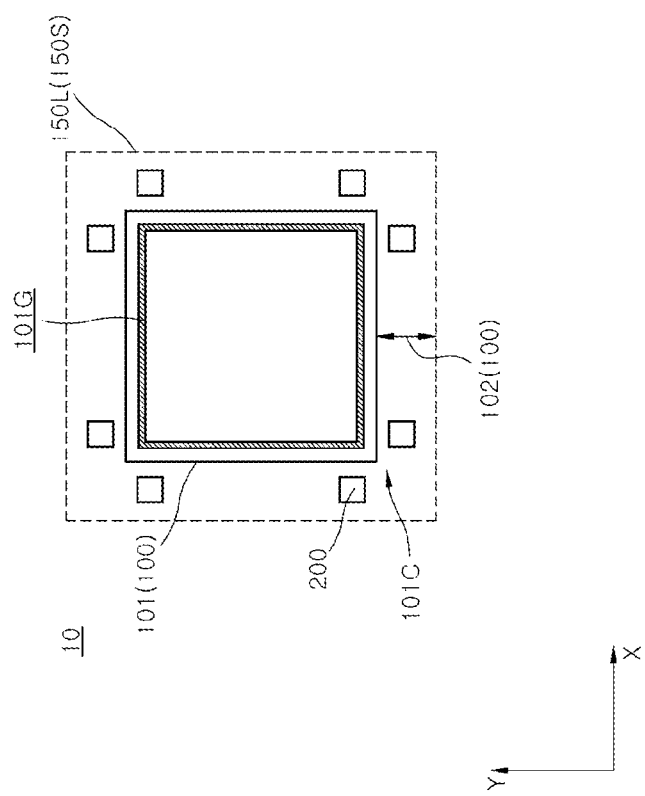
FIG. 2 is a schematic plan view illustrating a semiconductor device according to an embodiment of the present disclosure.

FIG. 2 is a schematic plan view illustrating a semiconductor device 10 according to an embodiment of the present disclosure. FIG. 2 may illustrate the semiconductor device 10 in the form of an individual semiconductor chip separated from the semiconductor device 10W of FIG. 1.

Referring to FIGS. 1 and 2, a dicing process may be performed along the dicing lines 150L to separate the semiconductor device 10 in the shape of an individual semiconductor chip from the semiconductor device 10W. The semiconductor device 10 may include crack sensors 200 that are disposed in the scribe lane region 102. The crack sensors 200 may be disposed in corner portions of the semiconductor device 10, that is, portions of the scribe lane region 102 that is adjacent to the rectangular-shaped corners 101C of each of the chip regions 101. The corner portions of the semiconductor device 10 may be portions where the dicing lines 150L intersect so that stress may be relatively more concentrated on the corner portions of the semiconductor device 10 in the dicing process. Accordingly, the cracks may be relatively predominantly generated in the corner portions of the semiconductor device 10 or the portions of the scribe lane region 102 that is adjacent to the corners 101C of the chip regions 101. By disposing the crack sensors 200 in the portions of the scribe lane region 102 that is adjacent to the corners 101C of the chip regions 101, it is possible to more effectively detect the cracks that may be generated in the semiconductor device 10.

Figure 3:
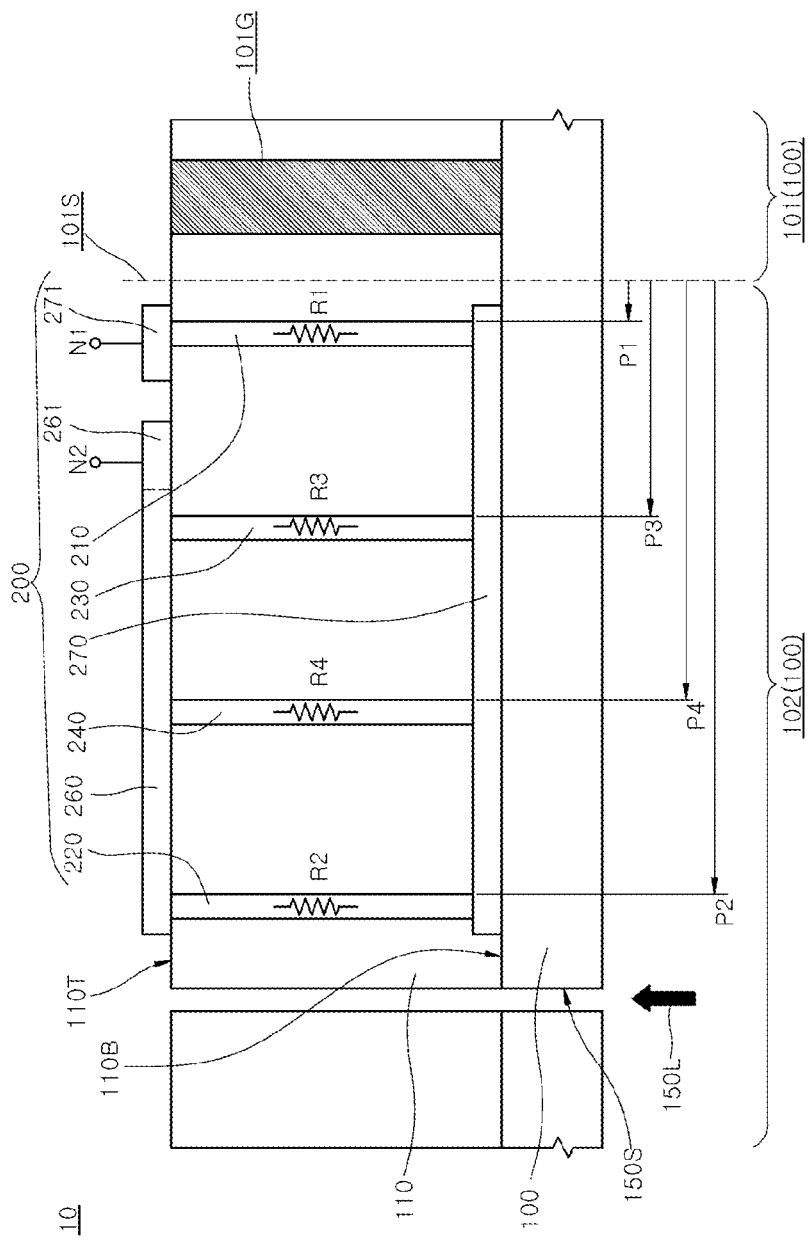
FIG. 3 is a schematic cross-sectional view illustrating a semiconductor device according to an embodiment of the present disclosure.

FIG. 3 is a schematic cross-sectional view illustrating a semiconductor device 10 according to an embodiment of the present disclosure. FIG. 3 may illustrate the semiconductor device 10 in the shape of an individual semiconductor chip separated from the semiconductor device 10W of FIG. 1.

Referring to FIG. 3, the semiconductor device 10 may include a semiconductor substrate 100, a target layer 110, and a crack sensor 200. The target layer 110 may refer to a target from which cracks are to be detected. The target layer 110 may be formed on the semiconductor substrate 100 and refer to a layer in which cracks may be generated or cracks may propagate. The target layer 110 may refer to a layer including a plurality of layers. The target layer 110 may be formed over a scribe lane region 102. The target layer 110 may be formed to extend from the scribe lane region 102 to a chip region 101. The target layer 110 may include a dielectric material layer. The target layer 110 may further include a conductive layer or a metal layer.

The crack sensor 200 may be configured to detect the cracks that may occur or propagate in the target layer 110. Elements constituting the crack sensor 200 may be disposed substantially over the scribe lane region 102 of the semiconductor substrate 100. Each of the crack sensor 200 may include a first conductive pattern 270, a second conductive pattern 260, a plurality of resistors 220, 230, and 240, a first node N1, and a second node N2. The crack sensor 200 may further include an additional resistor 210.

The first conductive pattern 270 and the second conductive pattern 260 may be configured as electrodes that substantially face each other with the target layer 110 that is interposed therebetween. Each of the first conductive pattern 270 and the second conductive pattern 260 may include a layer of a conductive material. The conductive material may include metal or a semiconductor material that is doped with a dopant. Each of the first conductive pattern 270 and the second conductive pattern 260 may include a metal material, such as aluminum (Al), copper (Cu), or tungsten (W).

The first conductive pattern 270 may be formed to be positioned on a bottom surface 110B of the target layer 110. The bottom surface 110B of the target layer 110 may be a surface of the target layer 110 that faces the semiconductor substrate 100. Another material layer may be further interposed between the bottom surface 110B of the target layer 110 and the semiconductor substrate 100. The second conductive pattern 260 may be formed to be positioned on a top surface 110T of the target layer 110. The top surface 110T of the target layer 110 may face the bottom surface 110B with the target layer 110 that is interposed therebetween or may be another surface of the target layer 100 that is opposite to the bottom surface 110B.

The first and second nodes N1 and N2 may be nodes that are connected to the first conductive pattern 270 and the second conductive pattern 260, respectively. A resistance meter (not shown) may be used to measure the total resistance of the resistors 210, 220, 230, and 240. The resistance meter may include a current-voltage meter that measures a current-voltage (I-V) curve. The first and second nodes N1 and N2 may include contact pads 271 and 261, respectively, to which probes for measuring the resistance contact. The first contact pad 271 may be disposed on the top surface 110T of the target layer 110 to be used as the first node N1. The second contact pad 261 may be disposed on the top surface 110T of the target layer 110 to be used as the second node N2. The second contact pad 261 may include an extended portion or an expanded portion of the second conductive pattern 260.

The first conductive pattern 270 may be disposed on the bottom surface 110B of the target layer 110 so that the first resistor 210 may connect the first conductive pattern 270 to the first node N1 or may connect the first conductive pattern 270 to the first contact pad 271. The first resistor 210 may refer to an additional resistor that is connected in series to the resistors 220, 230, and 240 of the crack sensor 200. The first resistor 210 may include a conductive via that is configured to substantially penetrate the target layer 110 to connect the first conductive pattern 270 and the first contact pad 271 to each other. The first resistor 210 may include a conductive wiring or a conductive pattern for connecting the first conductive pattern 270 and the first contact pad 271 to each other.

The resistors 220, 230, and 240 of the crack sensor 200 may be configured as sensing portions that substantially sense cracks. The resistors 220, 230, and 240 of the crack sensor 200 may be configured to vary the total resistance value of the resistors 220, 230, and 240 while being broken by the propagation of the crack. When some or all of the resistors 220, 230, and 240 of the crack sensor 200 are broken while the crack propagates, the total resistance value of the resistors 220, 230, and 240 or the total resistance value of the crack sensor 200 may be changed. The change in total resistance value may indicate whether or not cracks have occurred so that the crack sensor 200 may be used as a means for detecting whether cracks have occurred.

The resistors 220, 230, and 240 may be configured to substantially vertically penetrate the target layer 110. Each of the resistors 220, 230, and 240 may be formed in a shape of a conductive wiring or a shape of a conductive via of which one end is connected to the first conductive pattern 270 and the other opposite end is connected to the second conductive pattern 260.

The resistors 220, 230, and 240 may be configured to be connected in parallel to each other through the first conductive pattern 270 and the second conductive pattern 260. Because the resistors 220, 230, and 240 are connected in parallel to each other, different total resistance values may be detected based on the degree to which the resistors 220, 230, and 240 are broken by the cracks. Depending on the degree of variation of the total resistance values, it is possible to determine the degree to which the cracks have propagated. On the other hand, if the resistors 220, 230, and 240 are connected in series to each other, even if the degree to which the cracks break the resistors 220, 230, 240 is different, the total resistance values may be detected to be substantially the same.

The resistors 220, 230, and 240 may be disposed sequentially away from the boundary 101S over the scribe lane region 102 of the semiconductor substrate 100. The resistors 220, 230, and 240 may be disposed to be spaced apart from each other while sequentially moving away from the chip region 101 over the scribe lane region 102. The resistors 220, 230, and 240 may be disposed while being sequentially spaced apart from each other away from the boundary 101S between the chip region 101 and the scribe lane region 102. The resistors 220, 230, and 240 may be disposed between the boundary 101S of the chip region 101 and the scribe lane region 102 and the diced side surface 150S of the semiconductor device 10. The resistors 220, 230, and 240 may be sequentially disposed from the boundary 101S of the chip region 101 and the scribe lane region 102 toward the diced side surface 150S of the semiconductor device 10 and may be spaced apart from each other. The diced side surface 150S of the semiconductor device 10 may refer to a side surface of the target layer 110 and a side surface of the semiconductor substrate 100 and may be a side surface that faces the boundary 101S of the chip region 101 and the scribe lane region 102.

The resistors 220, 230, and 240 may include the second resistor 220, the third resistor 230, and the fourth resistor 240. More resistors may be further disposed between the second resistor 220, the third resistor 230, and the fourth resistor 240. The first resistor 210 that is connected to the first node 271 may be disposed between the boundary 101S of the chip region 101 and the scribe lane region 102 and the resistors 220, 230, and 240. The first resistor 210 may be disposed at position P1 that is spaced apart from the boundary 101S of the chip region 101 and the scribe lane region 102 by a certain distance. The first resistor 210 may be disposed at position P1, which is relatively close to the chip region 101. The second resistor 220 may be disposed at position P2 closer to the diced side surface 150S of the semiconductor device 10 than the first resistor 210. The second resistor 220 may be disposed at position P2, farthest from the boundary 101S of the chip region 101 and the scribe lane region 102. The third resistor 230 may be disposed at position P3 between the first resistor 210 and the second resistor 220, and the fourth resistor 240 may be positioned at position P4 between the second resistor 220 and the third resistor 230.

As described above, the first, third, fourth, and second resistors 210, 230, 240, and 220 may be sequentially disposed, so that as the cracks progress from the divided side surface 150S of the semiconductor device 10 toward the chip region 101, the cracks may sequentially break the second, fourth, third, and first resistors 220, 240, 230, and 210 in the order of the second, fourth, third, and first resistors 220, 240, 230, and 210. According to the degree of breakage of the second, fourth, and third resistors 220, 240, and 230, the total resistance values that are measured through the crack sensor 200 may be measured as different resistance values. The measured total resistance value may be a factor that indicates which of the second, fourth, and third resistors 220, 240, and 230 has been broken due to the crack. In this way, it is possible to identify the position of the broken resistor with the measured total resistance value, and thus, it is possible to identify the position at which the propagation of the crack has progressed.

The resistors 210, 220, 230, and 240 may be configured to provide substantially the same resistance values. The resistors 210, 220, 230, and 240 may be configured to provide different resistance values.

Referring to FIGS. 1, 2, and 3, the resistors 210, 220, 230, and 240 of the crack sensor 200 may be disposed on the scribe lane region 101 of the semiconductor substrate 100 that is adjacent to the guide wall 101G. The resistors 210, 220, 230, and 240 of the crack sensor 200 may be disposed on a portion of the scribe lane region 101 of the semiconductor substrate 100 that is adjacent to the rectangular-shaped side of the chip region 101. The resistors 210, 220, 230, and 240 of the crack sensor 200 may be disposed on a portion of the scribe lane region 101 of the semiconductor substrate 100 that is adjacent to the rectangular-shaped corner 101C of the chip region 101.

Figure 4:
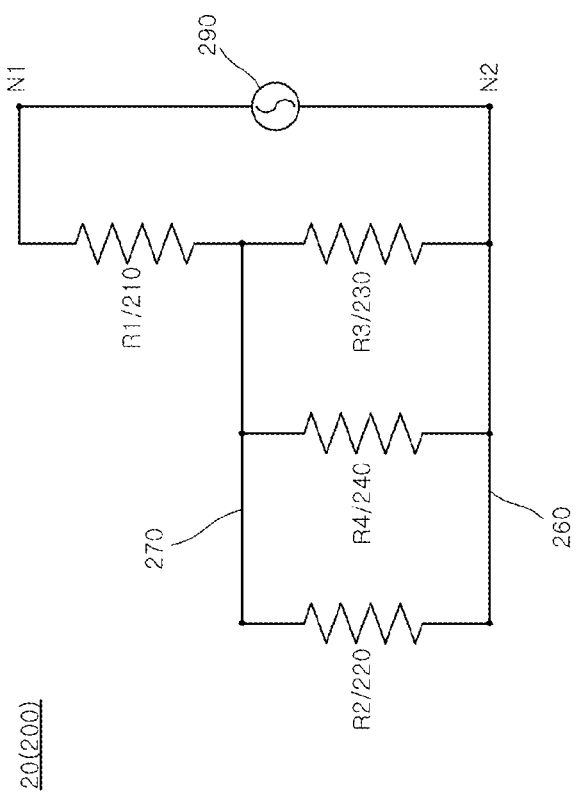
FIG. 4 is a schematic circuit diagram illustrating resistance components of a crack sensor of the semiconductor device of FIG. 3.

FIG. 4 is a schematic circuit diagram illustrating resistance components R1, R2, R3, and R4 of the crack sensor 200 of the semiconductor device 10 of FIG. 3.

Referring to FIGS. 3 and 4, the first resistance component R1 of the first resistor 210 may be connected in series to the first node N1 of the crack sensor 200. The second resistance component R2 of the second resistor 220, the third resistance component R3 of the third resistor 230, and the fourth resistance component R4 of the fourth resistor 240 may be connected in parallel to each other to configure a crack sensing unit of the crack sensor 200 that substantially senses a crack. The second, third, and fourth resistance components R2, R3, and R4 may be connected in parallel to form a first sensing resistance component Rs1, and the first sensing resistance component Rs1 may be connected to the first resistance component R1, in series. The first sensing resistance component Rs1 may have a resistance value that is calculated based on the formula 1/Rs1=1/R2+1/R3+1/R4. A resistance meter 290 may be connected to the first node N1 and the second node N2 of the crack sensor 200 to measure a first total resistance value R20 of the crack sensor 200. The first total resistance value R20 may have a resistance value that is calculated based on the formula R20=Rs1+R1.

As the crack progresses, the second resistor 220, the fourth resistor 240, and the third resistor 230 may be sequentially broken so that the parallelly connected sensing resistance component Rs may represent different resistance values according to the number of broken resistors, among the resistors 220, 240, and 230.

FIGS. 5 to 11 are schematic views illustrating crack sensing operations of the crack sensor 200 of FIG. 3.

Figure 5:
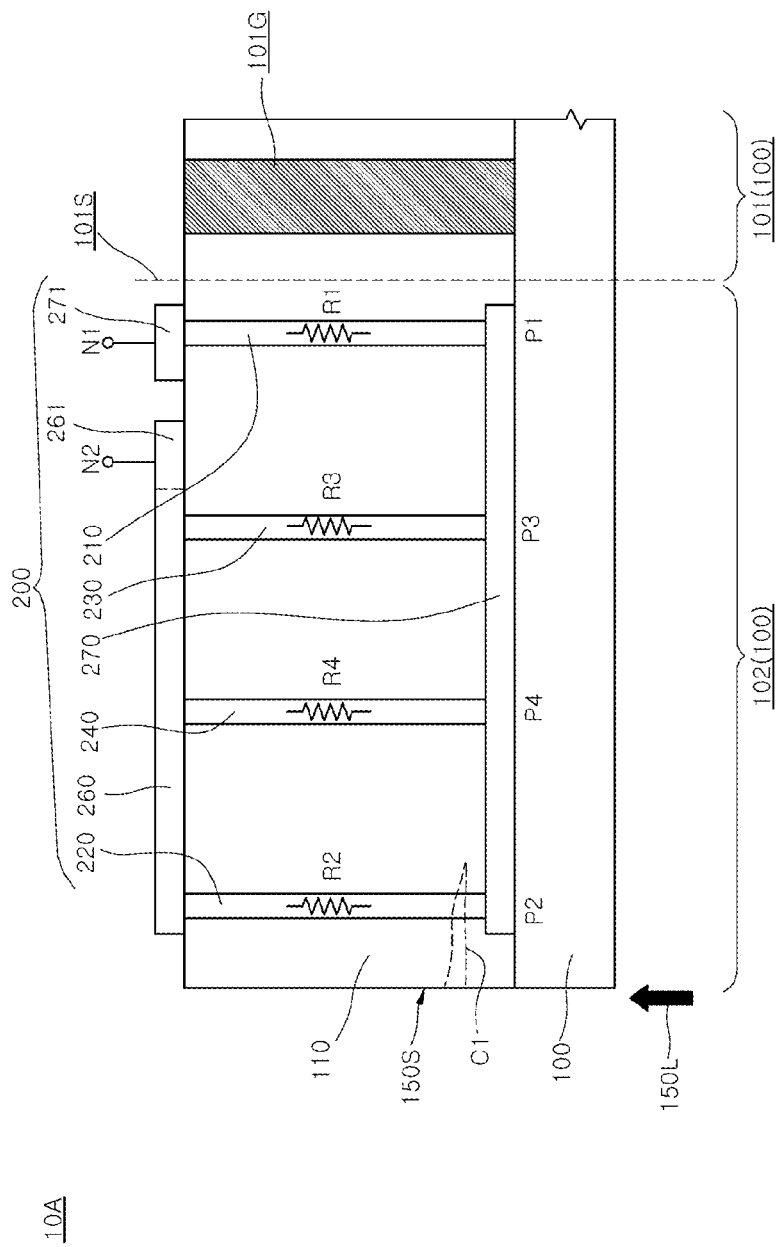
FIGS. 5 to 11 are schematic views illustrating a crack sensing operation of the crack sensor of the semiconductor device of FIG. 3.
Figure 6:
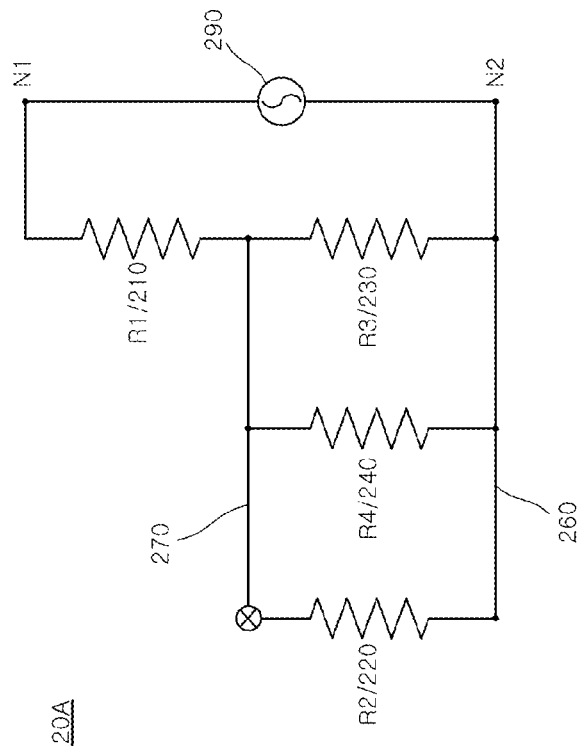

FIG. 5 is a schematic cross-sectional view illustrating a state in which a crack C1 of a semiconductor device 10A breaks the second resistor 220. FIG. 6 is a schematic circuit diagram 20A illustrating resistance components R1, R3, and R4 of the crack sensor 200 of FIG. 5.

Referring to FIGS. 5 and 6, as the crack C1 propagates inwardly from the diced side surface 150S, the second resistor 220 that is disposed at position P2 that is closest to the side surface 150S may be broken. When the second resistor 220 is broken, a current cannot flow through the second resistor 220. As described above, in a state in which the second resistor 220 is broken by the crack C1, a second sensing resistance component Rs2 may be calculated based on the third resistance component R3 and the fourth resistance component R4. The second sensing resistance component Rs2 may have a resistance value that is calculated based on the formula 1/Rs2=1/R3+1/R4.

The second sensing resistance component Rs2 may be different from the first sensing resistance component Rs1 in that the second sensing resistance component Rs2 has a greater resistance value than the first sensing resistance component Rs1 when the second resistor 220 is not broken. Accordingly, a second total resistance value R20A may represent a greater resistance value than the first total resistance value R20. As such, the sensing resistance components Rs1 and Rs2, in a state in which the crack C1 is not generated, may represent different resistance values compared to the sensing resistance components Rs1 and Rs2, in a state in which the second resistor 220 is broken by the crack C1. Because the measured total resistance values R20 and R20A have different resistance values, it is possible to confirm whether the crack C1 has occurred at position P2 at which the crack C1 has been generated by comparing the total resistance values R20 and R20A.

Figure 7:
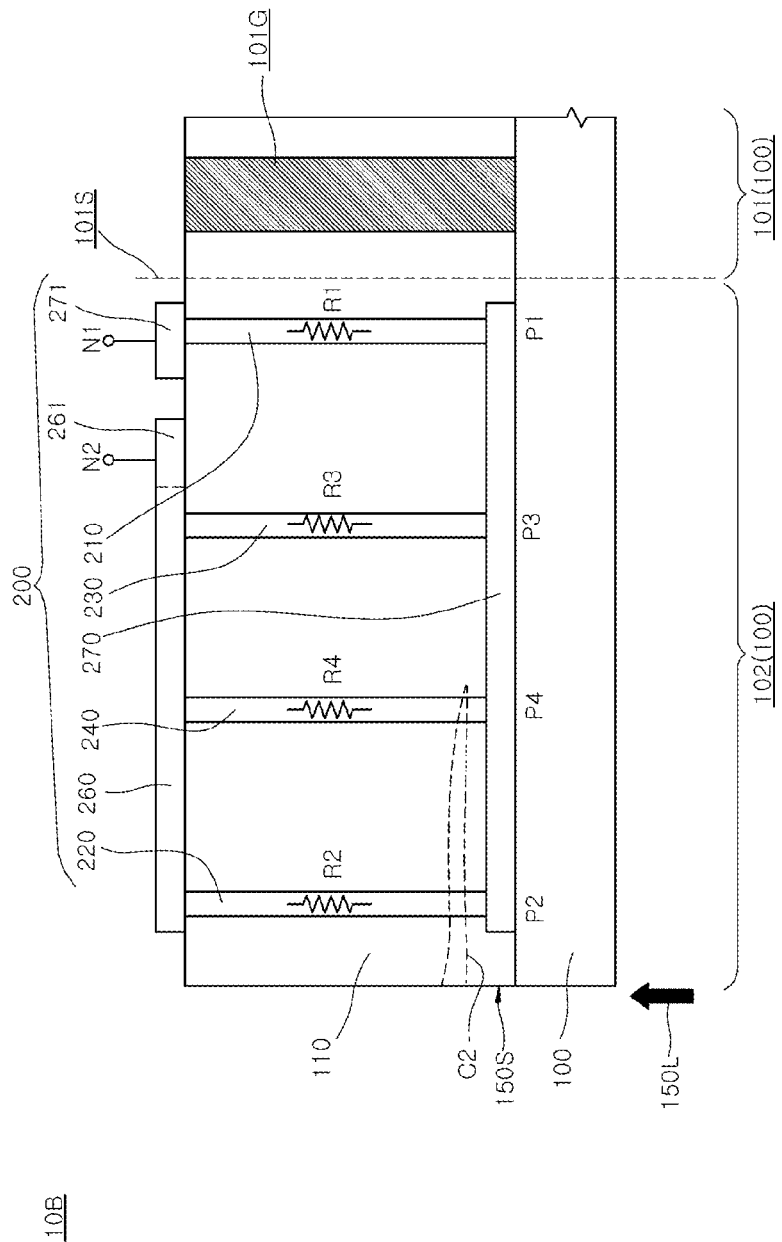
Figure 8:
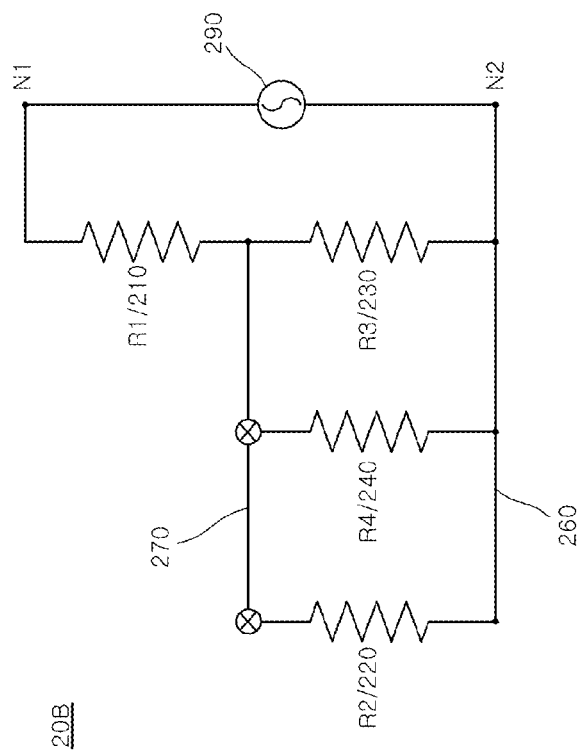

FIG. 7 is a schematic cross-sectional view illustrating a state in which a crack C2 of the semiconductor device 10B breaks the fourth resistor 240. FIG. 8 is a schematic circuit diagram 20B illustrating the resistance components R1 and R3 of the crack sensor 200 of FIG. 7.

Referring to FIGS. 7 and 8, as the crack C2 progresses further inwardly from the diced side surface 150S, not only the second resistor 220, but also the fourth resistor 240, may be broken. The fourth resistor 240 may be disposed at position P4 that is farther from the diced side surface 150S than position P2 of the second resistor 220. The fourth resistor 240 may be disposed closer to the chip region 101 or the boundary 101S than position P2 of the second resistor 220.

When the second resistor 220 and the fourth resistor 240 are broken, a current cannot flow through the second and fourth resistors 220 and 240. As such, in a state in which the second and fourth resistors 220 and 240 are broken by the crack C2, the third sensing resistance component Rs3 may be calculated as the third resistance component R3. The third sensing resistance component Rs3 may represent a resistance value that is different from the first sensing resistance component Rs1 in a state in which the second resistor 220 is not broken. The third sensing resistance component Rs3 may represent a resistance value that is different from the second sensing resistance component Rs2 in a state in which the second resistor 220 is broken and the fourth resistor 240 is not broken. The third sensing resistance component Rs3 may have a greater resistance value than the first sensing resistance component Rs1 and the second sensing resistance component Rs2. Accordingly, the third total resistance value R20B may be different from the first total resistance value R20 and the second total resistance value R20A and may represent a greater resistance value than the first total resistance value R20 and the second total resistance value R20A.

As described above, the sensing resistance component Rs1 in a state in which the crack C1 is not generated, the sensing resistance component Rs2 in a state in which the second resistor 220 is broken by the crack C1, and the sensing resistance component Rs3 in a state in which the second and fourth resistors 220 and 240 are broken by the crack C2 may represent different resistance values. Because the measured total resistance values R20, R20A, and R20B have different resistance values, it may be possible to confirm whether the cracks C1 and C2 have occurred at positions P2 or P4 at which the cracks C1 and C2 are generated or advanced, respectively, by comparing the total resistance values R20, R20A, R20B.

Figure 9:
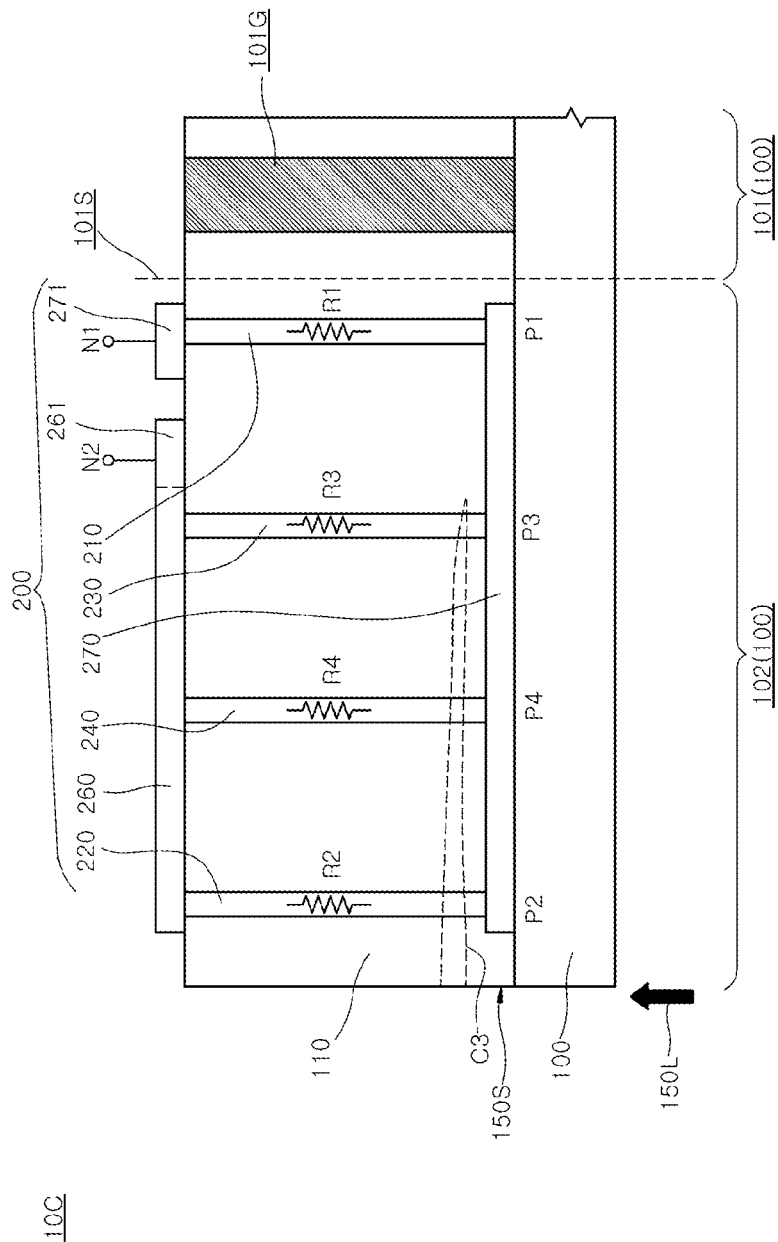
Figure 10:
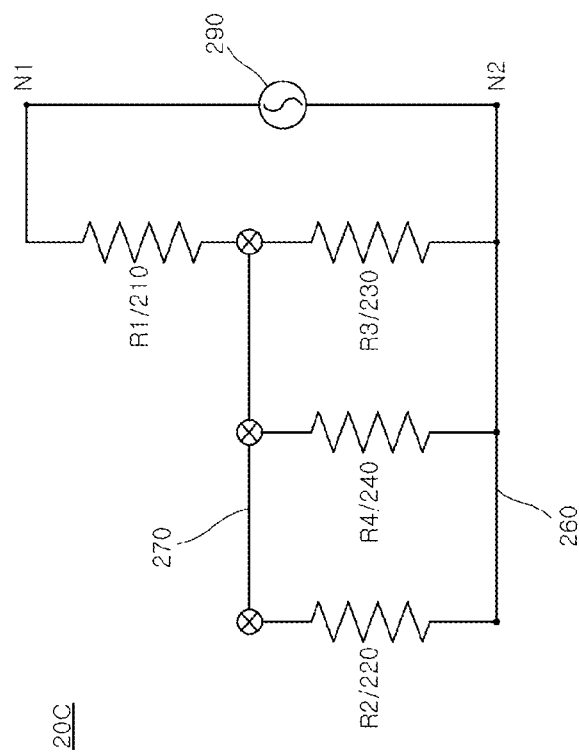

FIG. 9 is a schematic cross-sectional view illustrating a state in which a crack C3 of a semiconductor device 10C breaks the third resistor 230. FIG. 10 is a schematic circuit diagram 20C illustrating resistance components of the crack sensor 200 of FIG. 9.

Referring to FIGS. 9 and 10, as the crack C3 progresses further inwardly from the diced side surface 150S, not only the second resistor 220 and the fourth resistor 240, but also the third resistor 230, may be broken. The third resistor 230 may be disposed at position P3 farther from the diced side surface 150S than position P4 of the fourth resistor 240. The third resistor 230 may be disposed closer to the chip region 101 or the boundary 101S than position P4 of the fourth resistor 240.

When the second resistor 220, the fourth resistor 240, and the third resistor 230 are broken, a current cannot flow through the second, fourth, and third resistors 220, 240, 230. Even if the crack C3 does not break the first resistor 210, because the first resistor 210 is connected in series with the second, fourth, and third resistors 220, 240, and 230, no current flows even through the first resistor 210. As such, in a state in which the second, fourth, and third resistors 220, 240, and 230 are broken by the crack C3, the fourth sensing resistor Rs4 might not function as a resistor. Unlike the first, second, and third sensing resistance components Rs1, Rs2, and Rs3, the fourth sensing resistance component Rs4 may represent a substantially insulating state that is not measured as a specific resistance value. Accordingly, the fourth total resistance value R20C may be different from the first, second, and third total resistance values R20, R20A, and R20B and may represent a substantially insulative state.

As such, the sensing resistance component Rs1 in a state in which the crack C1 is not generated, the sensing resistance component Rs2 in a state in which the second resistor 220 is broken by the crack C1, the sensing resistance component Rs3 in a state in which the second and fourth resistors 220 and 240 are broken by the crack C2, and the sensing resistance components Rs4 in a state in which the second, fourth, and third resistors 220, 240, and 230 are broken by the crack C3 may represent different resistance values from each other. Because the measured total resistance values R20, R20A, R20B, and R20C have different resistance values, it is possible to confirm whether the cracks C1, C2, and C3 have occurred at positions P2, P4, and P3 at which the cracks C1, C2, and C3 are generated or advanced, respectively, by comparing the total resistance values R20, R20A, R20B, and R20C.

Figure 11:
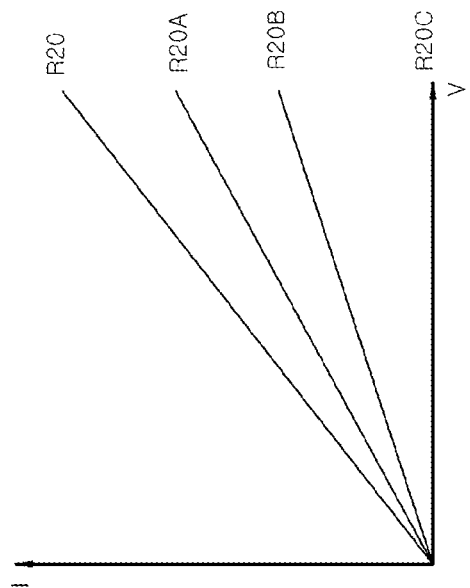

FIG. 11 is a schematic view illustrating current-voltage (I-V) curves showing total resistance values R20, R20A, R20B, and R20C that can be sensed by the crack sensor 200 of FIG. 3.

Referring to FIG. 11, in a state in which crack C1 is not generated as shown in FIG. 3, in a state in which the second resistor 220 is broken by the crack C1 as shown in FIG. 5, in a state in which the second and fourth resistors 220 and 240 are broken by the crack C2 as shown in FIG. 7, and in a state in which the second, fourth, and third resistors 220, 240, and 230 are broken by the crack C3 as shown in FIG. 9, the total resistance values R20, R20A, R20B, and R20C may have different resistance values or may be measured with different current-voltage curves. The current-voltage curves representing the total resistance values R20, R20A, R20B, and R20C, shown in FIG. 11, may be used as a reference for confirming whether cracks occur and the locations of crack propagation. It is possible to confirm the location where the cracks have progressed along with the occurrence of cracks by comparing the measured value measured through the crack sensor 200 or the measured current-voltage curve with the current-voltage curves representing the total resistance values R20, R20A, R20B, and R20C, shown in FIG. 11.

Figure 12:
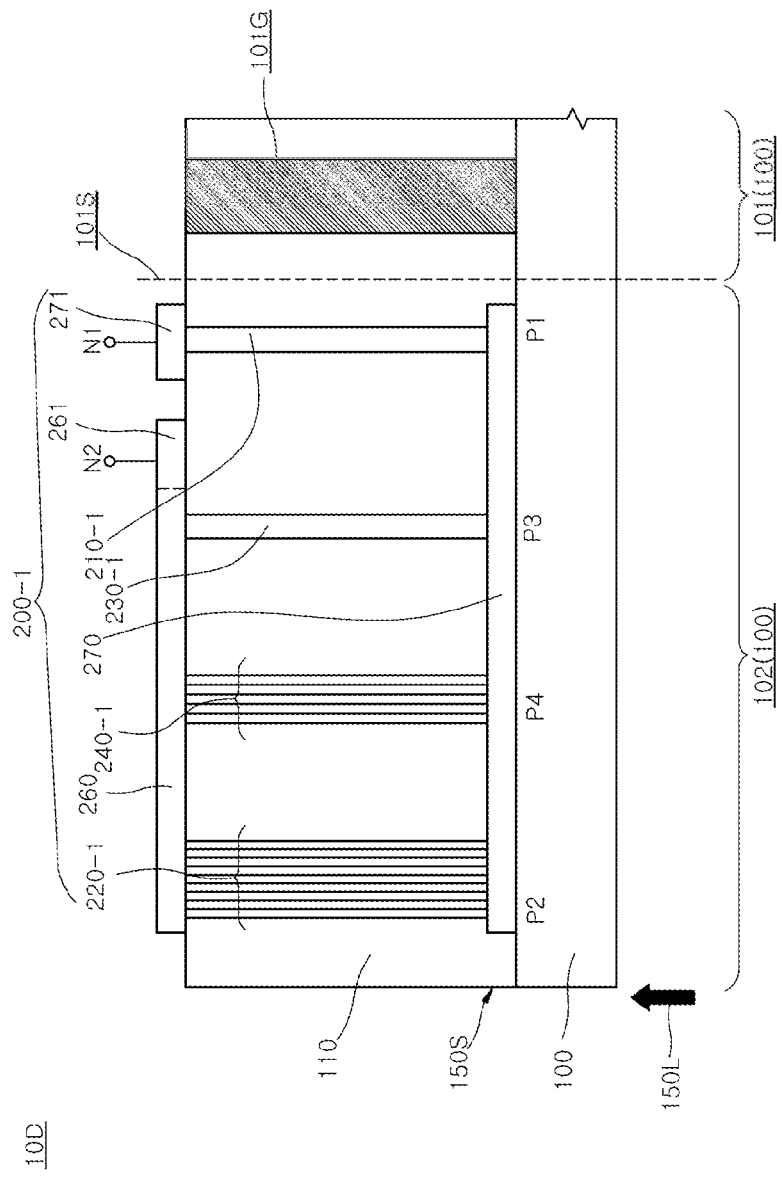
FIGS. 12 to 16 are schematic views illustrating semiconductor devices according to embodiments of the present disclosure.

FIG. 12 is a schematic cross-sectional view illustrating a semiconductor device 10D according to another embodiment of the present disclosure. In FIG. 12, elements indicated by the same reference numerals as in FIG. 3 may indicate substantially the same elements.

Referring to FIG. 12, the semiconductor device 10D may include a crack sensor 200-1. The crack sensor 200-1 may include a first conductive pattern 270, a second conductive pattern 260, a plurality of resistors 210-1, 220-1, 230-1, and 240-1. The resistors 210-1, 220-1, 230-1, and 240-1 may be configured to include conductive vias in different numbers. For example, the first resistor 210-1 and the third resistor 230-1 may be configured to include substantially the same number of conductive vias, and the second resistor 220-1 and the fourth resistor 240-1 may include a greater number of conductive vias than the third resistor 230-1. The fourth resistor 240-1 may include a smaller number of conductive vias than the second resistor 220-1.

The resistors 220-1, 230-1, and 240-1 may be configured to include different numbers of conductive vias so that the resistors 220-1, 230-1, and 240-1 may have different resistance values. Because the resistors 220-1, 230-1, and 240-1 have different resistance values, the differences between the total resistance values that can be measured by the crack sensor 200-1 may become greater according to the degree of crack propagation. Meanwhile, as illustrated in FIG. 3, the resistors 220, 230, and 240 may be configured to include the same number of conductive vias to be configured to have the same resistance value.

Figure 13:
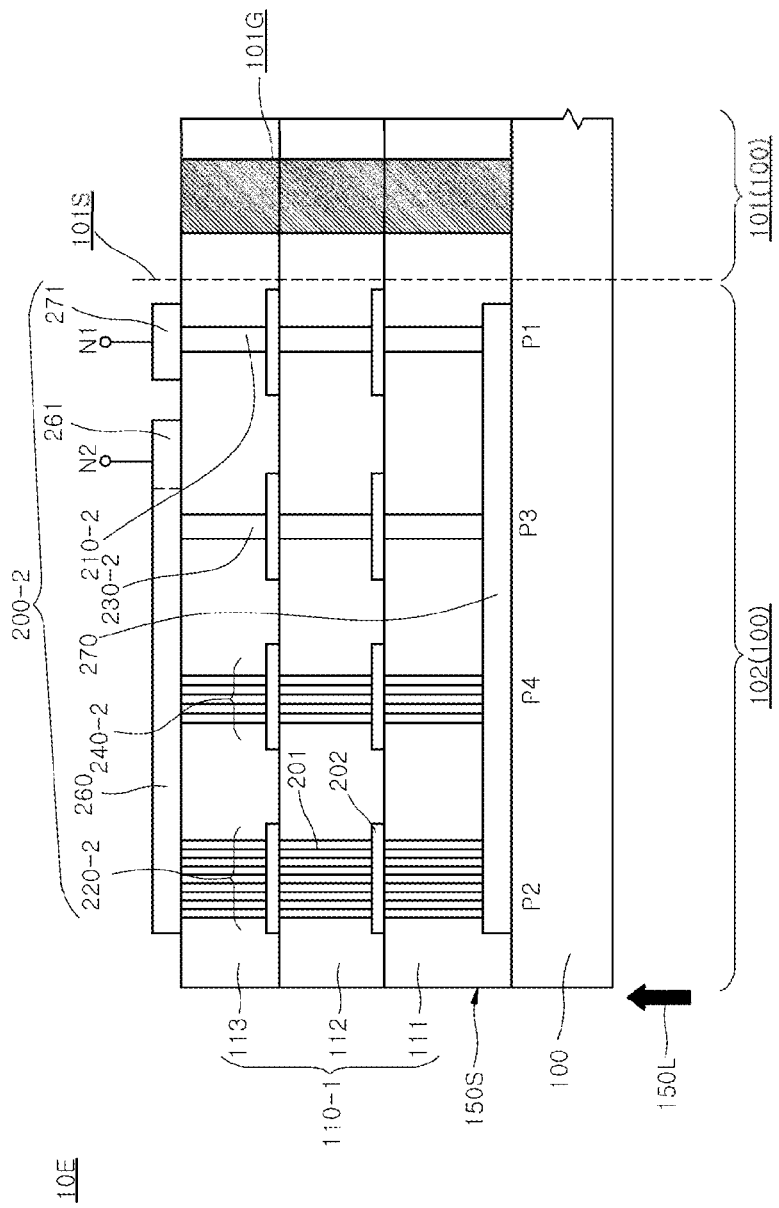

FIG. 13 is a schematic cross-sectional view illustrating a semiconductor device 10E according to another embodiment of the present disclosure. In FIG. 13, elements indicated by the same reference numerals as in FIG. 3 may indicate substantially the same elements.

Referring to FIG. 13, the semiconductor device 10E may include a crack sensor 200-2 and a target layer 110-1 that is a crack detection target. The target layer 110-1 may include a plurality of target sub-layers 111, 112, and 113. The second target sub-layer 112 may be stacked on the first target sub-layer 111, and the third target sub-layer 113 may be stacked on the second target sub-layer 112. The crack sensor 200-2 may include a first conductive pattern 270, a second conductive pattern 260, and a plurality of resistors 210-2, 220-2, 230-2, and 240-2. The first, second, third, and fourth resistors 210-2, 220-2, 230-2, and 240-2 may include structures in which conductive vias 201 and conductive lands 202 are combined. The conductive vias 201 may be formed in conductive patterns substantially penetrating the target sub-layers 111, 112, and 113. The conductive lands 202 may be disposed at interfaces between the target sub-layers 111, 112, and 113. The conductive vias 201 may be connected to the conductive lands 202.

Figure 14:
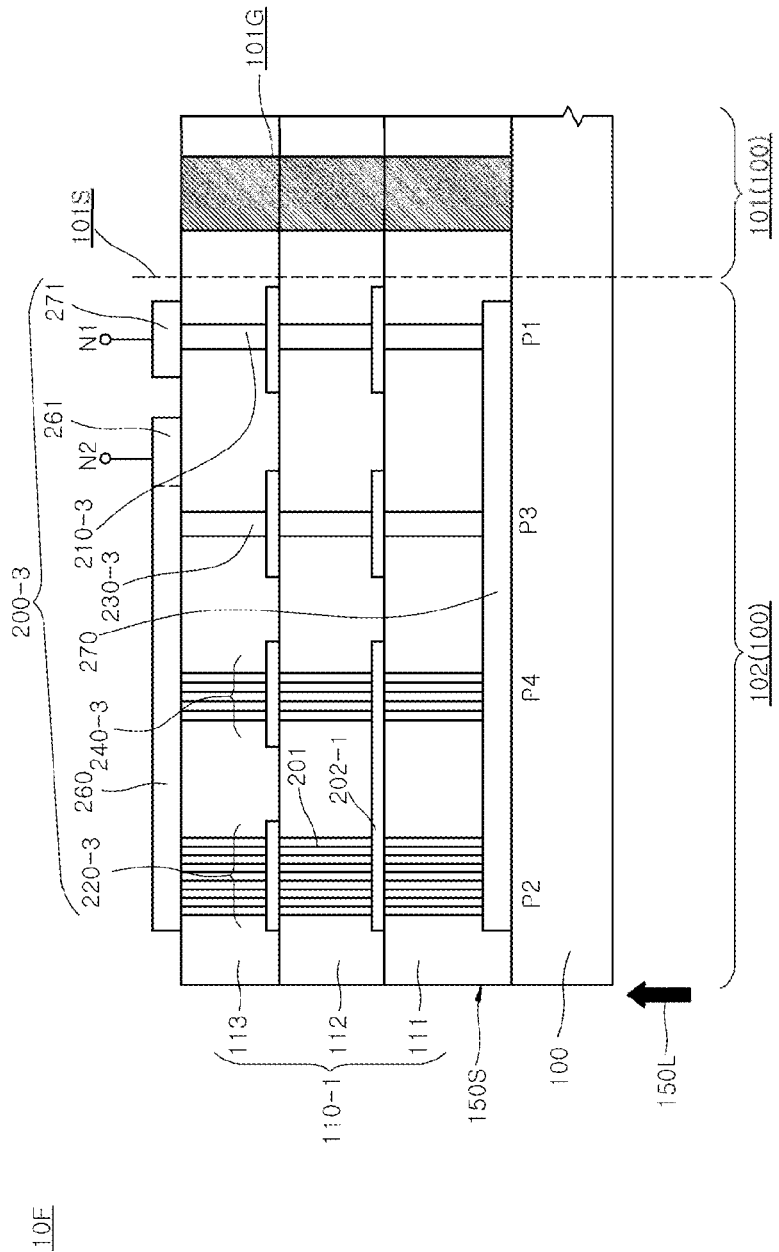

FIG. 14 is a schematic cross-sectional view illustrating a semiconductor device 10F according to another embodiment of the present disclosure. In FIG. 14, elements indicated by the same reference numerals as in FIGS. 3 and 13 may indicate substantially the same elements.

Referring to FIG. 14, the semiconductor device 10F may include a crack sensor 200-3 and a target layer 110-1 that is a crack detection target. The target layer 110-1 may include a plurality of target sub-layers 111, 112, and 113. The crack sensor 200-3 may include a first conductive pattern 270, a second conductive pattern 260, and a plurality of resistors 210-3, 220-3, 230-3, and 240-3. The first, second, third, and fourth resistors 210-3, 220-3, 230-3, and 240-3 may include structures in which conductive vias 201 and conductive lands are combined. Some of the conductive lands 202-1 may be extended to be connected to adjacent resistors.

Figure 15:
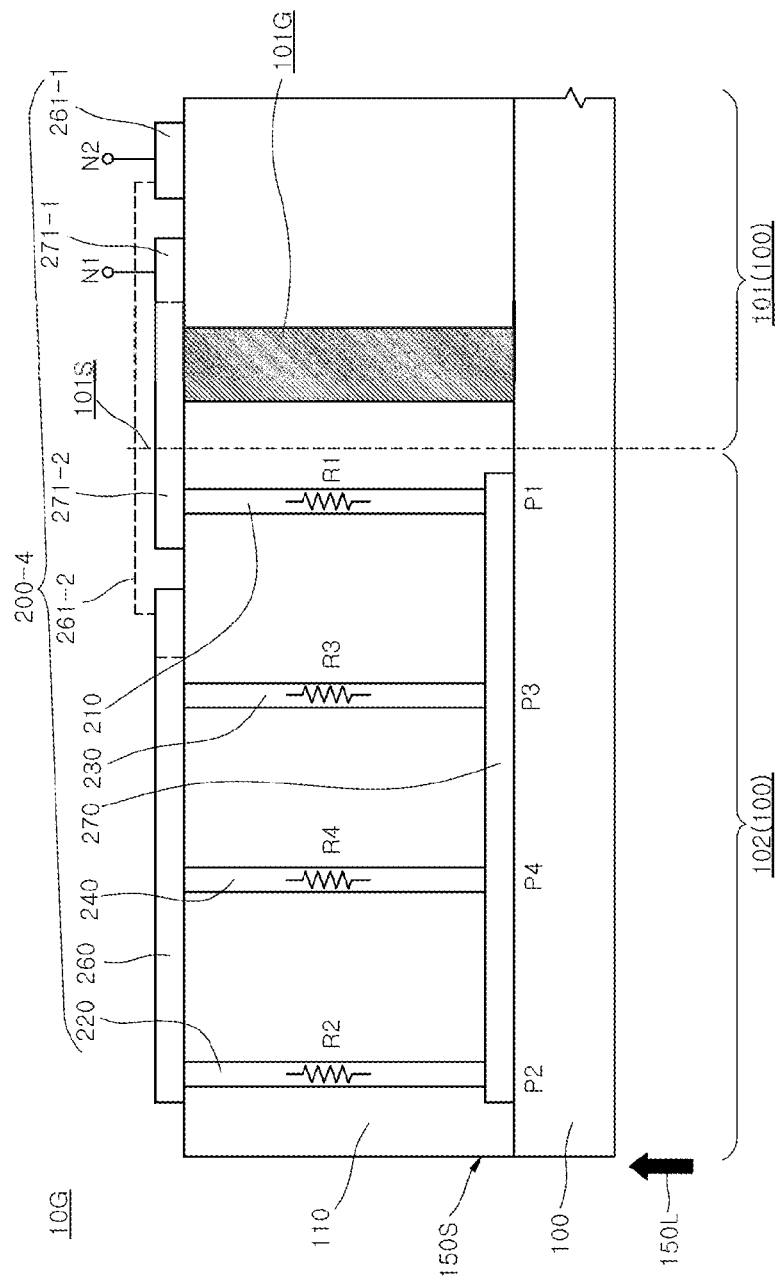

FIG. 15 is a schematic cross-sectional view illustrating a semiconductor device 10G according to another embodiment of the present disclosure. In FIG. 15, elements indicated by the same reference numerals as in FIG. 3 may indicate substantially the same elements.

Referring to FIG. 15, the semiconductor device 10G may include a crack sensor 200-4. The crack sensor 200-4 may include a first conductive pattern 270, a second conductive pattern 260, and a plurality of resistors 210, 220, 230, and 240. The crack sensor 200-4 may further include a first contact pad 271-1 that is connected to a first node N1 and a second contact pad 261-1 that is connected to a second node N2. The first contact pad 271-1 and the second contact pad 261-1 may be disposed over a chip region of a semiconductor substrate 100. As illustrated in FIG. 3, the first contact pad 271 and the second contact pad 261 may be disposed over a scribe lane region 102 of the semiconductor substrate 100. The first contact pad 271-1 and the second contact pad 261-1 may be disposed over the chip region 101 of the semiconductor substrate 100 so that it is possible to overcome the size and location limitations of the first contact pad 271-1 and the second contact pad 261-1, compared to the case in which the first contact pad 271 and the second contact pad 261 are disposed over the scribe lane region 102 of the semiconductor substrate 100.

The resistors 210, 220, 230, and 240 and the first and second conductive patterns 270 and 260 may be disposed over the scribe lane region 102 of the semiconductor substrate 100, while the first contact pad 271-1 and the second contact pad 261-1 are disposed over the chip region 101. Accordingly, a first extension portion 271-2 and a second extension portion 261-2 that connect the first and conductive pattern 270 and the second conductive pattern 260 to the first contact pad 271-1 and the second contact pad 261-1, respectively, may extend from the scribe lane region 102 to the chip region 101.

Figure 16:
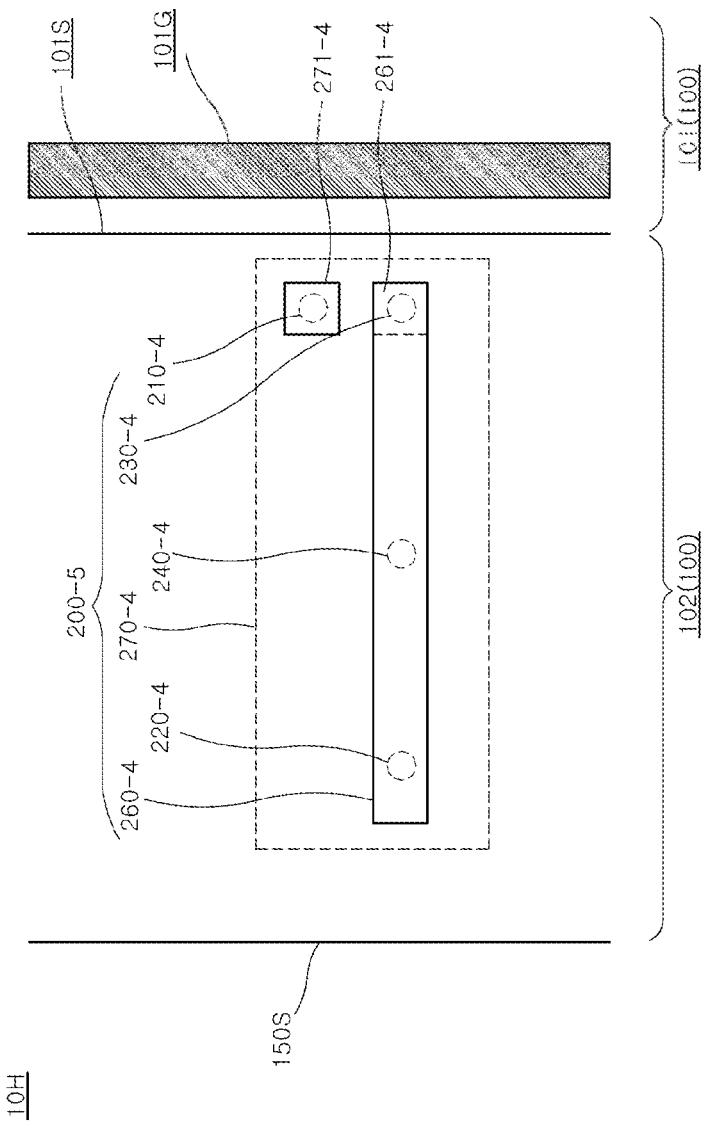

FIG. 16 is a schematic plan view illustrating a semiconductor device 10H according to another embodiment of the present disclosure. In FIG. 16, elements indicated by the same reference numerals as in FIG. 3 may indicate substantially the same elements.

Referring to FIG. 16, the semiconductor device 10H may include a crack sensor 200-5. The crack sensor 200-5 may include a first conductive pattern 270-4, a second conductive pattern 260-4, and a plurality of resistors 210-4, 220-4, 230-4, and 240-4. The crack sensor 200-5 may further include a first contact pad 271-4 that is connected to a first node N1 and a second contact pad 261-4 that is connected to a second node N2. The first resistor 210-4 that is introduced as an additional resistor may include a conductive via disposed while being spaced apart from the third resistor 230-4, which is one of the second, third, and fourth resistors 220-4, 230-4, and 240-4. The third resistor 230-4 and the first resistor 210-4 may be disposed side by side along a boundary 101S between the chip region 101 and the scribe lane region 102.

Figure 17:
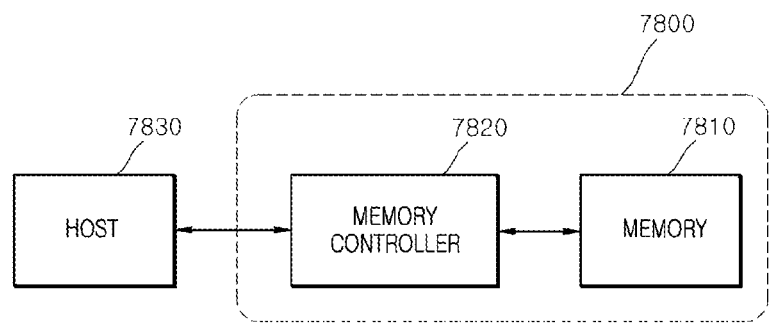
FIG. 17 is a block diagram illustrating an electronic system employing a memory card including a package according to an embodiment of the present disclosure.

FIG. 17 is a block diagram illustrating an electronic system including a memory card 7800 that employs at least one of the semiconductor packages according to the embodiments. The memory card 7800 may include a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 18:
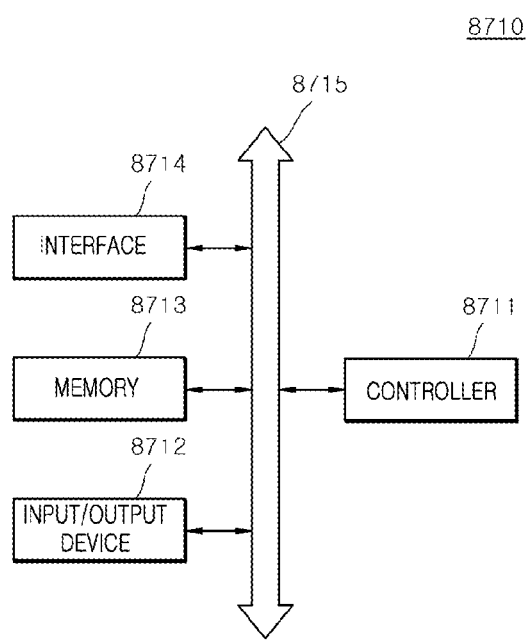
FIG. 18 is a block diagram illustrating an electronic system including a package according to an embodiment of the present disclosure.

FIG. 18 is a block diagram illustrating an electronic system 8710 including at least one of the semiconductor packages according to the embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include at least one of the semiconductor packages according to the embodiments of the present disclosure. The input/output device 8712 may include at least one selected among a keypad, a keyboard, a display device, a touchscreen and so forth. The memory 8713 may be a device for storing data. The memory 8713 may store data and/or commands to be executed by the controller 8711, and the like.

The memory 8713 may include a volatile memory device such as a DRAM and/or a nonvolatile memory device, such as a flash memory. For example, a flash memory may be mounted to an information processing system, such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system by using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor device comprising:
   a substrate including chip regions and a scribe lane region;
   a target layer disposed over the substrate; and
   a crack sensor in the target layer,
   wherein the crack sensor includes:
   a first conductive pattern positioned below the target layer;
   a second conductive pattern positioned over the target layer;
   a plurality of resistors substantially penetrating the target layer, the plurality of resistors connected in parallel to each other through the first conductive pattern and the second conductive pattern, wherein each of the plurality of resistors is disposed sequentially away from the chip region; and
   a first node and a second node connected to the first conductive pattern and the second conductive patterns, respectively.

2. A semiconductor device comprising:
   a target layer disposed over a substrate; and
   a crack sensor in the target layer,
   wherein the crack sensor includes:
   a first conductive pattern positioned below the target layer;
   a second conductive pattern positioned over the target layer;
   a plurality of resistors substantially penetrating the target layer, the plurality of resistors connected in parallel to each other through the first conductive pattern and the second conductive pattern; and
   a first node and a second node connected to the first conductive pattern and the second conductive pattern, respectively.

3. A semiconductor device comprising:
   a substrate including chip regions and a scribe lane region;
   a target layer disposed over the substrate; and
   a crack sensor in a portion of the scribe lane region,
   wherein the crack sensor includes:
   a first conductive pattern positioned below the target layer;
   a second conductive pattern positioned over the target layer, and
   a plurality of resistors substantially penetrating the target layer, the plurality of resistors connected in parallel to each other through the first conductive pattern and the second conductive pattern, and
   wherein each of the plurality of resistors is disposed sequentially away from the chip region.

4. The semiconductor device of claim 3, wherein each of the plurality of resistors is configured to provide substantially the same resistance values.

5. The semiconductor device of claim 3, wherein the plurality of resistors are configured to provide different resistance values from each other.

6. The semiconductor device of claim 5, wherein the plurality of resistors corresponds to a different number of conductive vias that substantially penetrate the target layer.

* * * * *